United States Patent [19]

Haragashira

[11] Patent Number: 4,882,541
[45] Date of Patent: Nov. 21, 1989

[54] AUTOMATIC IMPEDANCE ADJUSTER FOR MRI SYSTEM

[75] Inventor: Motoji Haragashira, Ootawara, Japan

[73] Assignee: Kabushiki Kaisha Toshiba, Kawasaki, Japan

[21] Appl. No.: 190,451

[22] Filed: May 5, 1988

[30] Foreign Application Priority Data

May 8, 1987 [JP] Japan .................. 62-111942

[51] Int. Cl.$^4$ ........................... G01R 33/20
[52] U.S. Cl. .................... 324/322; 333/17.3
[58] Field of Search .......... 324/300, 307, 309, 318, 324/322; 333/17 M; 455/123, 125; 343/861, 862

[56] References Cited

U.S. PATENT DOCUMENTS

| | | | |
|---|---|---|---|
| 3,919,644 | 11/1975 | Smolka | 333/17 M |
| 4,028,645 | 6/1977 | Tressa | 333/17 M |
| 4,356,458 | 10/1982 | Armitage | 333/17 M |
| 4,493,112 | 1/1985 | Bruene | 333/17 M |
| 4,633,181 | 12/1986 | Murphy et al. | 324/322 |
| 4,783,629 | 11/1988 | Arakawa | 324/322 |

OTHER PUBLICATIONS

Lodstrom, A Complex Impedance Meter, Proceedings, RF Expo East, Nov. 10–12, 1986.

Primary Examiner—Michael J. Tokar
Attorney, Agent, or Firm—Finnegan, Henderson, Farabow, Garrett and Dunner

[57] ABSTRACT

An automatic impedance adjuster for an MRI system has an impedance adjusting section, an oscillator, a detector, and a controller. The impedance adjusting section is provided to a probe head, and allows variable adjustment of real and imaginary parts of an impedance of the probe head. The oscillator has a predetermined output impedance, and supplies a signal to the probe head. The detector is connected between the probe head and the oscillator, and outputs detection signals respectively corresponding to real and imaginary parts of the impedance of the probe head. The controller supplies a control signal to the impedance adjusting section in response to the signals corresponding to the real and imaginary parts obtained from the detector, and performs control such that the real and imaginary parts of the impedance of the probe head coincide with a predetermined impedance.

7 Claims, 5 Drawing Sheets

AUTOMATIC IMPEDANCE ADJUSTER FOR MRI SYSTEM

BACKGROUND OF THE INVENTION

1. Field of the Invention

The present invention relates to an automatic impedance adjuster for adjusting an impedance of a probe head for transmitting/receiving a radio-frequence (RF) signal to be equal to a characteristic impedance of a feeder line in a magnetic resonance imaging (MRI) system.

2. Description of the Related Art

A probe head in the MRI system serves as an antenna for transmitting an RF signal for exciting a magnetic resonance (RF) phenomenon, and for receiving an RF signal, i.e., an MR signal, generated by the MR phenomenon. The probe head includes one type commonly used for both transmission and reception of an RF signal, and the other type used for only reception of an RF signal. The probe head has an RF coil consisting of saddle coils.

Figure 1:
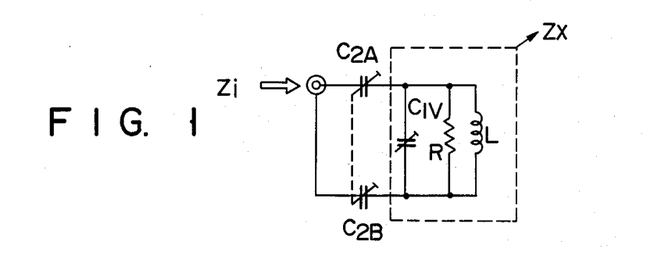
FIG. 1 shows an equivalent circuit of a probe head.

FIG. 1 shows an equivalent circuit of a probe head. The probe head is connected to a cable of characteristic impedance $Z_c$ (in many cases, $Z_c = 50 \Omega$). A probe head of a type used for both transmission and reception is usually fixed at a specific position. However, a reception type probe head is arranged at a variety of positions in accordance with diagnosis modes. The probe head represented by this equivalent circuit is constituted by variable capacitors $C_{1V}$, $C_{2A}$, and $C_{2B}$ (the capacitance of variable capacitor $C_{1V}$ is $C_1$, and capacitances of variable capacitors $C_{2A}$ and $C_{2B}$ are respectively $C_2$) connected to an RF coil, and equivalent inductance L of the RF coil, and equivalent parallel resistor R of the RF coil. Note that reference symbol $Z_i$ denotes an input impedance of the probe head.

When this probe head is used, input impedance $Z_i$ must be adjusted to be equal to characteristic impedance $Z_c$ of a cable.

This is for the following two reasons. (1) If $Z_i \neq Z_c$, transmission loss of an MR signal occurs in a feeder line, and S/N characteristics are degraded. (2) A low-noise amplifier used in an MRI system is normally designed to have input impedance $Z_c$ in correspondence with a cable normally used. Therefore, if $Z_i \neq Z_c$, i.e., if the amplifier is connected to a signal source having a signal source impedance other than $Z_c$, a low-noise component cannot be assured since noise figure matching is impaired.

In the equivalent circuit of FIG. 1, if both resistance R and impedance $Z_i$ are real numbers, the relationships between capacitances $C_1$ and $C_2$ and impedance $Z_i$ are respectively represented as follows.

$$C_2 = 2/\omega \sqrt{Z_i(R - Z_i)} \text{ [Farad]} \quad (1)$$

$$C_1 = 1/\omega^2 L - (1/\omega R)\{\sqrt{(R - Z_i)/Z_i}\} \text{ [Farad]} \quad (2)$$

($\omega = 2\pi f$; f [Hz] is a resonance frequency of an MR signal)

As can be seen from equations (1) and (2), if impedance $Z_i$ (which is set to be a pure resistance) is increased, capacitance $C_2$ is decreased, and capacitance $C_1$ is increased. More specifically, if resistance R and inductance L are constant, capacitance $C_2$ can be decreased (capacitance $C_1$ is slightly increased accordingly), so that impedance $Z_i$ as a pure resistance can be increased.

From equations (1) and (2), impedance $Z_X$ of a circuit portion surrounded by a broken line in FIG. 1 is calculated as follows:

$$\begin{aligned} Z_X &= 1/\{(1/R) + (1/j\omega L) + j\omega C_1\} \\ &= 1/[(1/R) + j\{(-1/R)\sqrt{(R - Z_i)/Z_i}\}] \\ &= R/\{1 - j\sqrt{R(R - Z_i)/Z_i}\} \end{aligned} \quad (3)$$

Then, $$Z_X = Z_i + j\sqrt{Z_i(R - Z_i)}$$

In equation (3), the first term, i.e., $Z_i$ represents a pure resistance component, and the second term, i.e., $j\sqrt{Z_i(R-Z_i)}$ represents an inductive reactance.

Impedance $Z_Y$ of a circuit portion constituted by two capacitors $C_{2A}$ and $C_{2B}$ can be represented by:

$$\begin{aligned} Z_Y &= 1/\{j\omega(C_2/2)\} \\ &= -j\sqrt{Z_i(R - Z_i)} \end{aligned} \quad (4)$$

As can be seen from equations (3) and (4), impedance $Z_i$ is constituted by impedance $Z_X$ formed by capacitance $C_1$, resistance R, and inductance L, and impedance $Z_Y$ formed by two capacitances $C_2$. In order to obtain impedance $Z_i$ as a pure resistance, an imaginary part (inductive reactance component) in equation (3) can be canceled to zero by an imaginary part (capacitive reactance component) in equation (4).

As described above, in order to satisfy condition $Z_i = Z_c$, if $Z_i > Z_c$, adjustment is performed as follows. That is, capacitance $C_2$ is decreased, and capacitance $C_1$ is increased to cancel the imaginary part generated when capacitance $C_2$ is decreased, so that impedance $Z_i$ is decreased. If $Z_i < Z_c$, adjustment is performed as follows. Capacitance $C_2$ is increased and capacitance $C_1$ is increased, so that impedance $Z_i$ is decreased.

Figure 2:
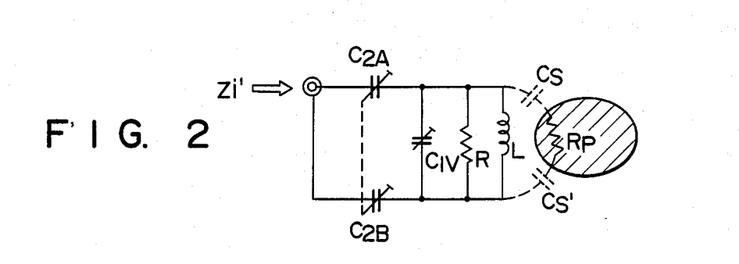
FIG. 2 shows an equivalent circuit of a probe head when an object to be examined is considered.
Figure 3:
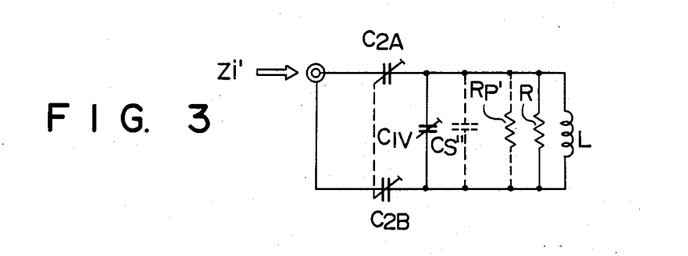
FIG. 3 shows an equivalent circuit of FIG. 2.
Figure 4:
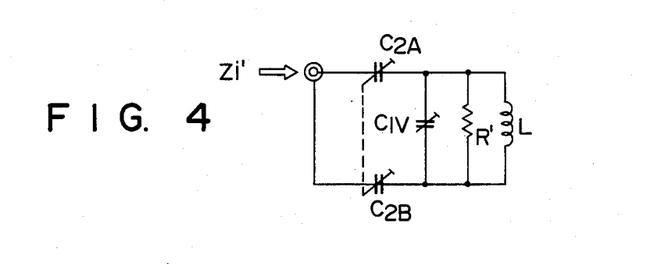
FIG. 4 shows an equivalent circuit of FIG. 3.

The probe head itself is required to have high Q (quality factor). Since an object to be examined (human body) comes closer to the probe head during imaging, the equivalent circuit as a primary approximation of the probe head during actual imaging is as shown in FIG. 2. Capacitances Cs and Cs' are stray capacitances between an object and a coil, and resistance Rp is an equivalent resistance of the object. Therefore, since these capacitances Cs and Cs' and resistance Rp are added, an impedance is not $Z_i$ but $Z_i'$. The arrangement of FIG. 2 can be equivalently transformed, as shown in FIG. 3, and the arrangement of FIG. 3 can be further simplified, as shown in FIG. 4. Capacitance Cs'' and resistance Rp' shown in FIG. 3 are respectively an equivalent capacitance and an equivalent resistance when a circuit consisting of capacitances Cs and Cs' and resistance Rp is parallel-transformed. In FIG. 4, $$R' \approx R_p' R/(R_p' + R)$$
$$C_1' = C_s'' + C_1$$

In the equivalent circuit of FIG. 4, the relationships between capacitances $C_2$ of variable capacitors $C_{2A}$ and $C_{2B}$, capacitance $C_1'$ of variable capacitor $C_{1V}$ and impedance Zc are represented by the following equations based on condition $Zi'=Zc$ in substantially the same manner as in equations (1) and (2):

$$C_2 = 2/\omega \sqrt{Zc(R' - Zc)} \text{ [Farad]} \quad (1')$$

$$C_1' = 1/\omega^2 L - (1/\omega R')\{\sqrt{(R' - Zc)/Zc}\} \text{ [Farad]} \quad (2')$$

Therefore, when capacitances $C_1'$ and $C_2$ are adjusted in the same manner as in FIG. 1, condition $Zi=Zc$ can be satisfied.

In a conventional apparatus, this adjustment is performed as follows. An oscillator having output impedance Zc (pure resistance) is prepared. A directional coupler is inserted between the oscillator and the probe head. A reflection power of the oscillator output by the probe head is derived and monitored through the directional coupler, and capacitances $C_1'$ and $C_2$ are varied, so that a condition yielding reflection power=0 is detected in a trial and error manner.

In this manner, in the conventional adjusting method, two variable capacitors $C_1'$ and $C_2$ must be simultaneously adjusted by manual operation, resulting in a cumbersome adjustment. In this case, the adjustment often depends on skills or experiences, resulting in poor work efficiency.

Instead of the manual operation, an automatic adjusting method using a microprocessor and the like is proposed. However, most adjustment is performed depending on the decision function of the microprocessor, and this also results in poor adjustment efficiency.

SUMMARY OF THE INVENTION

The present invention has been made in consideration of the above situation and has as its object to provide an automatic impedance adjuster for an MRI system, which allows efficient adjustment with simple hardware.

In order to achieve the above object, an automatic impedance adjuster for an MRI system according to the present invention comprises a detector for separately detecting real and imaginary parts of an impedance of a probe head, and a controller for supplying, to the probe head, a control signal for optimally adjusting voltages in accordance with real- and imaginary-part signals obtained by the detector.

According to the automatic impedance adjuster for the MRI system of the present invention, real and imaginary parts of the impedance of the probe head are separately detected, and control is made to cause these detection signals to be zero, so that the impedance of the probe head is adjusted to be equal to a characteristic impedance. Therefore, adjustment can be easily and automatically performed without requiring a manual operation, resulting in efficient adjustment.

DETAILED DESCRIPTION OF THE PREFERRED EMBODIMENTS

The principle of the present invention will be described below.

In an article "A Complex Impedance Meter (Carl G. Lodstroem, Dow-Key Microwave Corporation)" in RF expo east (Nov. 10–12, 1986, Boston, Massachusetts", a series circuit of four $\lambda/8$ cables 71, 72, 73, and 74 is connected between oscillator 1 of output impedance Zc and load 2 of impedance $Z_L$, so that real and imaginary parts of the impedance of load 2 can be easily and separately detected in the forms corresponding to voltages, as shown in FIG. 5.

More specifically, attenuator 5 for precisely setting an impedance to be Zc (=50 $\Omega$) is connected between oscillator 1 and first $\lambda/8$ cable 71. As shown in FIG. 5, a series circuit of diode D4, variable resistor $R_1$, and diode $D_2$ is connected between the node between attenuator 5 and first $\lambda/8$ cable 71 and the node between second and third $\lambda/8$ cables 72 and 73. A series circuit of diode $D_1$, variable resistor $R_2$, and diode $D_3$ is connected between the node between first and second $\lambda/8$ cables 71 and 72 and the node between third and fourth $\lambda/8$ cables 73 and 74, as shown in FIG. 5. DC voltmeter 3 (of a high input impedance) corresponding to the real part is connected to a slider terminal of variable resistor $R_1$. DC voltmeter 4 (of a high input impedance) corresponding to an imaginary part is connected to a slider terminal of variable resistor $R_2$. Variable resistors $R_1$ and $R_2$ are constituted by so-called trimming potentiometers. Cables 71 to 74 each have a cable length precisely coinciding with wavelength $\lambda/8$ of an output from oscillator 1.

Figure 5:
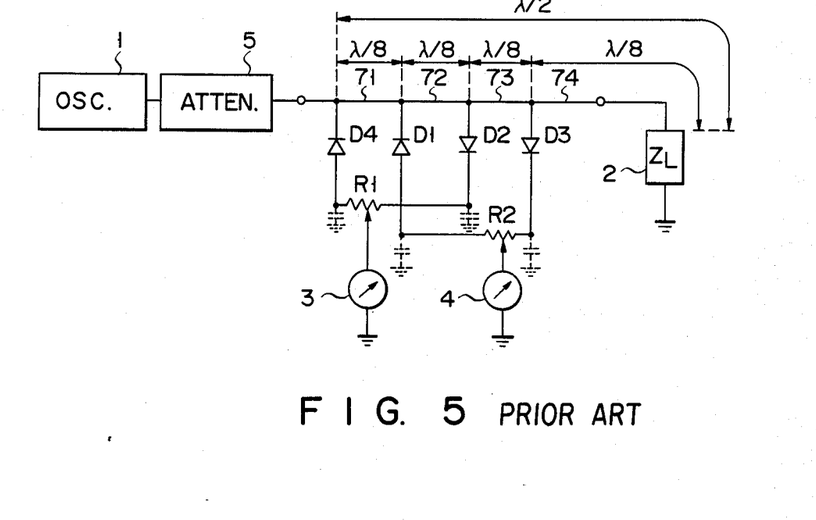
FIG. 5 is a block diagram showing a principle arrangement of an impedance detector employed in an automatic impedance adjuster for an MRI system according to an embodiment of the present invention.

In the arrangement of FIG. 5, assume that load 2 of $Z_L=Zc$ is connected, and variable resistors $R_1$ and $R_2$ are adjusted in advance so that voltmeters 3 and 4 respectively indicate 0 [V], thereby setting an initial state. In this state, if the real part of load impedance $Z_L$ is smaller than impedance Zc, real-part voltmeter 3 indicates a negative voltage; otherwise, indicates a positive voltage. If the imaginary part of load impedance $Z_L$ is inductive, imaginary-part voltmeter 4 indicates a negative voltage, and if capacitive, it indicates a positive voltage. Therefore, upon observation of indications of real- and imaginary-part voltmeters 3 and 4, an offset of the value of load impedance $Z_L$ with respect to characteristic impedance Zc can be determined.

Figure 6:
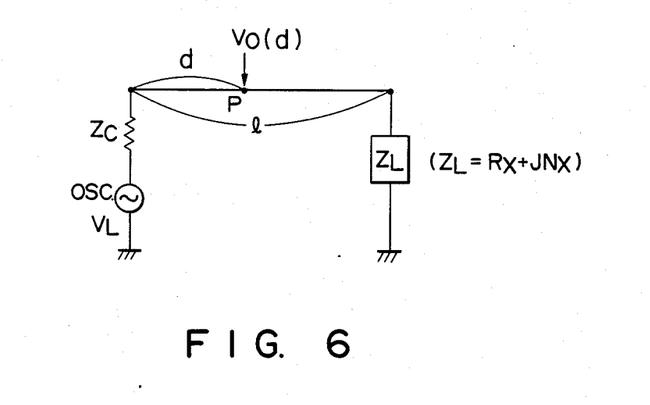
FIGS. 6, 7, 8, 9, and 10 are circuit diagrams for explaining the principle of the impedance detector shown in FIG. 5.

The above-mentioned detector will be described in more detail. More specifically, if a circuit shown in FIG. 6 is considered, voltage $V_0$ at point P is as follows:

$$V_0(d) = V_L \cos \beta(l-d) + j(Zc/I_L) \sin \beta(l-d)$$

where since $\beta = 2\pi/\lambda$ and $Z_L = V_L/I_L$, $V_O(d)$ is given by the following equation:

$$V_0(d) = V_L[\cos\{2\pi(1-d)/\lambda\} + j(Zc/Z_L)\sin\{2\pi(1-d)/\lambda\}] \quad (5)$$

Figure 7:
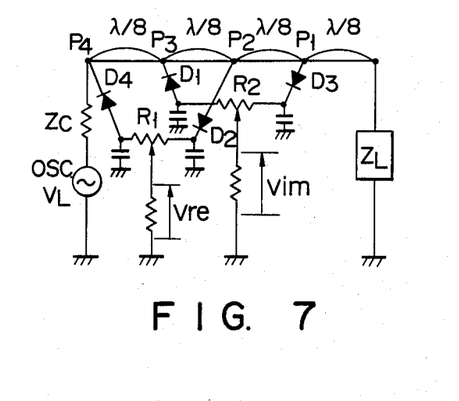

The principle diagram of the detector, i.e., a complex impedance meter by $\lambda/8$ cables is as shown in FIG. 7.

Voltages at points $P_1$, $P_2$, $P_3$, and $P_4$ in FIG. 7 are respectively given as $V_1$, $V_2$, $V_3$, and $V_4$. A signal source impedance is assumed to coincide with characteristic impedance Zc of a $\lambda/8$ cable.

Since the positions of points $P_1$, $P_2$, $P_3$, and $P_4$ respectively correspond to integer multiples of $\lambda/8$, $$1-d = \lambda/8,\ 2\lambda/8,\ 3\lambda/8,\ 4\lambda/8,\ \text{and}\ \beta = 2\phi/\lambda$$

then, $$\beta(1-d) = (\phi/4),\ (\phi/2),\ (3\phi/4),\ \text{and}\ \phi.$$

If these results are substituted in equation (5), $V_1$, $V_2$, and $V_4$ are respectively given by:

$$\begin{aligned}
V_1 &= V_L\{\cos(\pi/4) + j(Z_L/Zc)\sin(\pi/4)\} \\
&= (V_L/\sqrt{2}\,Zc)(Zc + jZ_L) \\
V_2 &= V_L\{\cos(\pi/2) + j(Z_L/Zc)\sin(\pi/2)\} \\
&= (V_L/Zc)(jZ_L) \\
V_3 &= (V_L/\sqrt{2}\,Zc)(-Zc + jZ_L) \\
V_4 &= V_L
\end{aligned}$$

Figure 8:
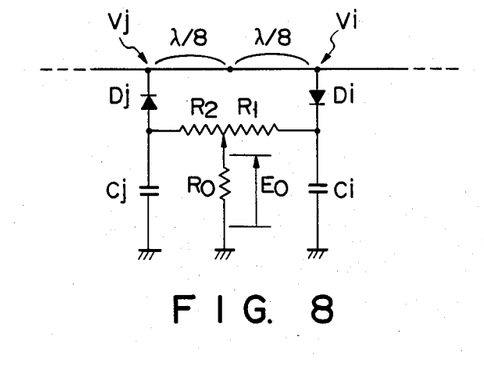
Figure 9:
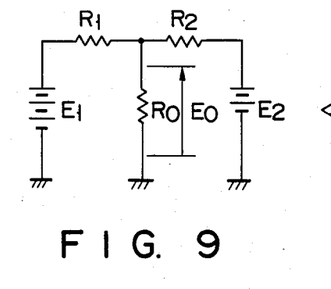
Figure 10:
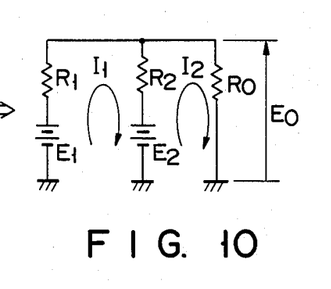

If points $P_1$ and $P_3$ (or $P_2$ and $P_4$) in FIG. 7 are represented by i and j, FIG. 7 can be expressed as shown in FIG. 8. FIG. 8 can be represented by equivalent circuits of FIGS. 9 and 10.

$$\begin{aligned}
R_1 I_1 + R_2(I_1 - I_2) &= E_1 - E_2 \\
R_2(I_2 - I_1) + R_0 I_2 &= E_2
\end{aligned} \quad (6)$$

From equation (6), $$R_1 I_1 + R_0 I_2 = E_1 \quad (7)$$

$$(R_1 + R_2)I_1 - R_2 I_2 = E_1 - E_2 \quad (6')$$

Equations (7) and (6') are solved for current $I_2$:

$$\begin{aligned}
I_2 &= (R_2 E_1 + R_1 E_2)/(R_1 R_2 + R_0 R_1 + R_2 R_0) \\
E_0 &= R_0 I_2 \\
&= R_0(R_2 E_1 + R_1 E_2)/\{R_1 R_2 + R_0 (R_1 + R_2)\}
\end{aligned}$$

Theoretically, $R_1 = R_2$ can be yielded, and hence, voltage $E_0$ is given by:
$$E_0 = \{(E_1 + E_2)R_0\}/(R_1 + 2R_0)$$

Assuming that $R_1 (=R_2) << R_0$, voltage $E_0$ is as follows:

$$E_0 = (E_1 + E_2)/2 = (|V_i| - |V_j|)/2$$

Since voltages $V_i$ and $V_j$ are rectified by diodes $D_i$ and $D_j$ and then smoothed by capacitances $C_i$ and $C_j$, they take maximum values, i.e., amplitude voltages $E_1$ and $E_2$.

If an unknown impedance is represented by $Z_L = R_X + jN_X$, (i) Voltage Vim corresponding to an imaginary part is as follows:

$$\begin{aligned}
\text{Vim} &= (|V_1| - |V_3|)/2 \\
|V_1| &= (|V_L|/\sqrt{2}\cdot Zc)\sqrt{(Zc - N_X)^2 + R_X^2} \\
|V_3| &= (|V_L|/\sqrt{2}\cdot Zc)\sqrt{(Zc - N_X)^2 + R_X^2}
\end{aligned}$$

By substitution, $$\text{Vim} = -\sqrt{2}\cdot|V_L|\,[N_X/\{\sqrt{(Zc-N_X)^2 + R_X^2} + \sqrt{(Zc+N_X)^2 + R_X^2}\}] \quad (8)$$

In this manner, a voltage reflecting a negative or positive level of $N_X$ can be generated.

(ii) Voltage Vre corresponding to a real part is given by:

$$\begin{aligned}
\text{Vre} &= (|V_2| - |V_4|)/2 \\
|V_2| &= (|V_L|/Zc)\sqrt{R_X^2 + N_X^2} \\
|V_4| &= |V_L| \\
\text{Vre} &= (|V_L|/2Zc)(\sqrt{R_X^2 + N_X^2} - Zc) \\
&= (|V_L|/2Zc)[\{(R_X^2 - Zc^2) + N_X^2\}/(\sqrt{R_X^2 + N_X^2} + Zc)]
\end{aligned}$$

Assuming that $Z_L = R_X$ ($N_X = 0$), $$\text{Vre} = (|V_L|/2Zc)(R_X - Zc) \quad \ldots (9)$$

As described above, voltage Vim reflecting imaginary part $N_X$ of unknown load impedance $Z_L = R_X + jN_X$ can be obtained. Load impedance $Z_L$ is adjusted to yield voltage Vim=0. More specifically, if $N_X = 0$, voltage Vre reflecting a difference between real part $R_X$ and characteristic impedance Zc can be obtained.

An automatic impedance adjuster for an MRI system according to an embodiment of the present invention based on the above-mentioned principle will be described hereinafter with reference to the accompanying drawings.

Figure 11:
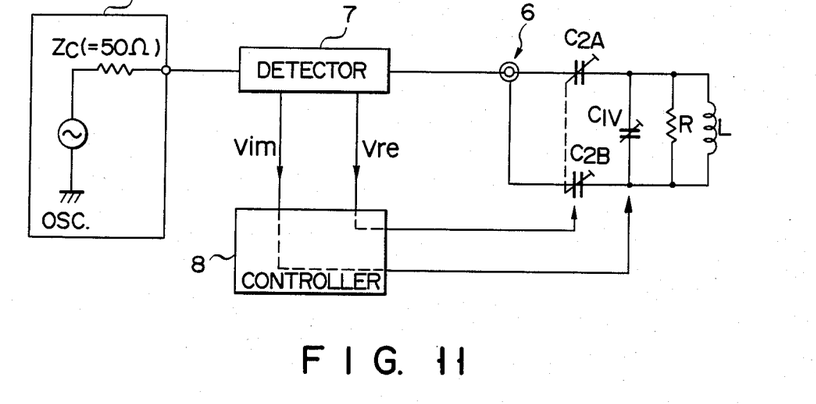
FIG. 11 is a block diagram showing an arrangement of an automatic impedance adjuster for an MRI system according to an embodiment of the present invention.
Figure 12:
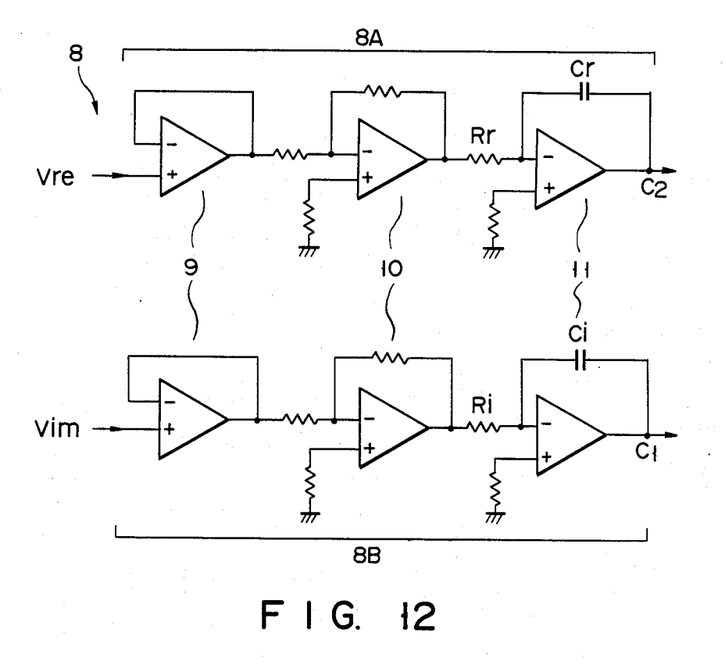
FIG. 12 is a block diagram showing a detailed arrangement of a controller of the adjuster shown in FIG. 11.

FIG. 11 is a block diagram showing an automatic impedance adjuster for an MRI system according to the present invention. Detector 7 is connected between oscillator 1 of output impedance Zc and probe head 6, and controller 8 is connected between detector 7 and probe head 6. Detector 7 is constituted by $\lambda/8$ cables in the same manner as in FIG. 5, so that real- and imaginary-part voltages representing impedance Zi of probe head 6 are separately detected. Controller 8 is arranged as shown in FIG. 12 (to be described later). In accordance with real- and imaginary-part voltages Vre and Vim detected by detector 7, controller 8 supplies control signals for adjusting the voltages to be zero to variable capacitors $C_{1V}$, $C_{2A}$, and $C_{2B}$ of probe head 6.

The operation of controller 8 will be described below in detail.

If a positive real-part voltage is detected by detector 7, Zi > Zc can be discriminated from the principle of the present invention (based on equation (1)). Therefore, a control signal for decreasing capacitances $C_2$ of probe head 6 is supplied to variable capacitors $C_{2A}$ and $C_{2B}$.

Thus, impedance Zi is decreased. When impedance Zi is decreased and real-part voltage Vre becomes 0 [V], supply of the control signal to variable capacitors $C_{2A}$ and $C_{2B}$ is stopped.

If a negative real-part voltage is detected by detector 7, it can be determined that Zi<Zc contrary to the above case. Therefore, a control signal for increasing capacitance $C_2$ is supplied to variable capacitors $C_{2A}$ and $C_{2B}$. Thus, impedance Zi is increased. With this control operation, real-part voltage Vre can be made 0 [V].

If positive imaginary-part voltage Vim is detected by detector 7, it can be determined based on the above-mentioned principle that the impedance is capacitive. Therefore, a control signal for decreasing capacitance $C_1$ is supplied to variable capacitor $C_{1V}$. Thus, since the imaginary part is changed to be inductive, it can be canceled. When imaginary-part voltage Vim becomes 0 [V], supply of the control signal to variable capacitor $C_{1V}$ is stopped.

If negative imaginary-part voltage Vim is detected by detector 7, it can be discriminated that the imaginary part is inductive contrary to the above case. Therefore, a control signal for increasing capacitance $C_1$ is supplied to variable capacitor $C_{1V}$. Thus, the imaginary part is changed to be capacitive, so that imaginary-part voltage Vim can be adjusted to be 0 [V].

In accordance with real- and imaginary-part voltages Vre and Vim detected by detector 7, controller 8 supplies control signals, i.e., negative feedback (NFB) signals, for adjusting the voltages to be zero to variable capacitors $C_{2A}$, $C_{2B}$ and $C_{1V}$ of probe head 6. Therefore, the impedance can be adjusted to finally satisfy condition Zi=Zc.

However, when NFBs of the identical response properties are performed for capacitances $C_2$ and $C_1$, impedance Zi may oscillate without being converged to Zc. For this reason, a response time of the NFB for one of real and imaginary parts is set to be shorter than the other. Then, one can reach a target value (becomes Zc [Ω] or j·0 [Ω]) earlier than the other, resulting in no oscillation. Therefore, impedance Zi can be converged to Zc. In practice, when detector 7 shown in FIG. 5 is used, the response time of the imaginary-part NFB is preferably set to be shorter than that of the real-part NFB.

If one of real- and imaginary-part voltages Vre and Vim becomes 0 [V], these voltages can be subjected to integration so that the control state of capacitance $C_2$ or $C_1$ can be maintained. More specifically, one of these voltages is integrated, and variable capacitor $C_{2A}$, $C_{2B}$, or $C_{1V}$ is controlled to have one-to-one correspondence with the integral value. Even if either detection voltage becomes 0 [V], the control state can be maintained.

When all the matching is achieved, both real- and imaginary-part voltages become 0 [V]. In this case, adjustment control of capacitances $C_2$ and $C_1$ is stopped.

FIG. 12 is a block diagram showing a detailed arrangement of controller 8. Controller 8 is constituted by real-part control section 8A and imaginary-part control section 8B. Each of real- and imaginary-part control sections 8A and 8B comprises buffer stage 9, inversion/amplification stage 10, and inversion/integration stage 11. The output from each inversion/integration stage 11 is impedance-matched, and is then converted to a digital value by an A/D (analog-to-digital) converter and is retained. Then, the digital value is converted to an analog value by a D/A (digital-to-analog) converter, and is then output as a control voltage for capacitances $C_1$ and $C_2$. Inversion/integration stage 11 of real-part control section 8A outputs a control voltage for capacitance $C_2$. Inversion/integration stage 11 of imaginary-part control section 8B outputs a control voltage for capacitance $C_1$. In order to achieve different response times in real- and imaginary-part sections, the relationship between time constant CrRr of the real-part section and time constant CiRi of the imaginary-part section must be maintained to be CiRi>>CrRr (or CrRr>>CiRi). Note that a cable having a length corresponding to an integer multiple of λ/2 (or a circuit equivalent thereto) can be connected between detector 7 and probe head 6.

Figure 13:
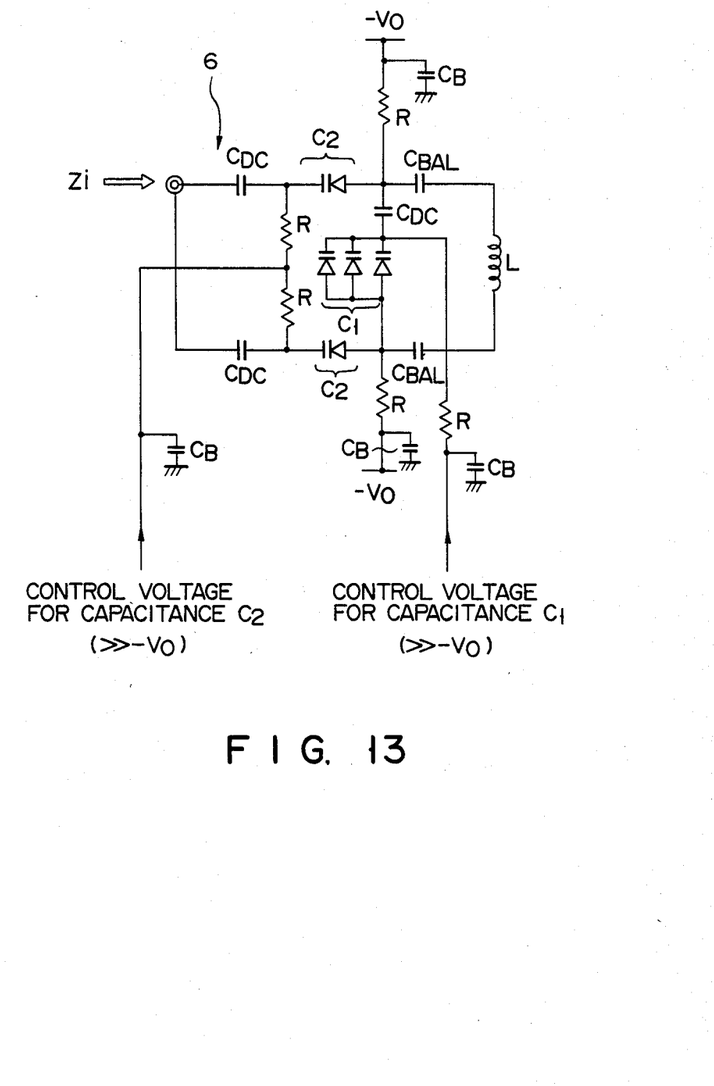
FIG. 13 is a circuit diagram showing a detailed arrangement of a probe head of the adjuster shown in FIG. 11.

FIG. 13 shows a detailed arrangement of probe head 6, wherein capacitances $C_2$ and $C_1$ are given by variable capacitance diodes. Variable capacitance diodes of capacitances $C_2$ and $C_2$ respectively receive control voltages from real- and imaginary-part control sections 8A and 8B shown in FIG. 12. The higher a reverse bias voltage becomes, the lower the capacitance of the variable capacitance diode becomes. Note that in FIG. 13, capacitances $C_{DC}$, $C_{BAL}$, and $C_B$ are illustrated in addition to capacitances $C_1$ and $C_2$.

The operation of this embodiment will be described below.

Initialization is performed such that real- and imaginary-part voltages Vre and Vim of detector 7 become 0 [V] while reference load $Z_L$ having impedance Zc is connected. Probe head 6 is connected in place of load $Z_L$, and automatic impedance adjustment is performed in accordance with real- and imaginary-part voltages Vre and Vim.

When imaginary-part voltage Vim is a positive voltage, capacitance $C_1$ of probe head 6 is subjected to NFB to be decreased by controller 8, so that the voltage can be adjusted to 0 [V]. When imaginary-part voltage Vim is a negative voltage, capacitance $C_1$ is subjected to NFB to be increased, so that the voltage can be adjusted to 0 [V].

When real-part voltage Vre is a positive voltage, capacitance $C_2$ of probe head 6 is subjected to NFB to be decreased by controller 8, so that the voltage can be adjusted to be 0 [V]. When real-part voltage Vre is a negative voltage, capacitance $C_2$ is subjected to NFB to be increased, so that the voltage can be adjusted to 0 [V].

Therefore, even if real- and imaginary-part voltages Vre and Vim are positive or negative voltages, they can be automatically adjusted to be 0 [V]. Thus, the impedance can be automatically adjusted to satisfy condition Zi=Zc.

According to this embodiment, since impedance Zi of a probe head can be automatically adjusted to be equal to characteristic impedance Zc without requiring a manual operation, efficient adjustment can be performed. Since the adjuster is simple, it can be manufactured at low cost, and the throughput of patient diagnosis can be improved by automatic impedance adjustment.

As variable capacitors $C_{1V}$, $C_{2A}$, and $C_{2B}$ in probe head 6, variable capacitors such as vacuum capacitors achieved by a mechanical operation can be employed, and a drive speed of an actuator by a motor can be controlled in proportion to a detection voltage. With this arrangement, an integration stage can be omitted. This is because the rotational angle of the actuator is proportional to an integral value of a speed, and if the detection voltage becomes 0 [V], the actuator is automatically stopped while maintaining that angle. In this case, signs must be adjusted so that the detection voltage and the rotating direction satisfy the NFB relationship, as a matter of course.

For a transmission/reception probe head, a mechanical variable capacitor such as a vacuum capacitor is preferably used since high power is used. For a reception probe head, a variable capacitance diode can be used since only low power is used.

What is claimed is:

1. An automatic impedance adjuster for adjusting an impedance of a probe head in an MRI (magnetic resonance imaging) system to be equal to characteristic impedance, comprising:
   an impedance adjusting element, provided to said probe head, for allowing variable adjustment of real and imaginary parts of an impedance of said probe head;
   oscillator means, having a predetermined output impedance, for supplying a signal to said probe head;
   detection means, connected between said probe head and said oscillator means, for outputting detection signals respectively corresponding to the real and imaginary parts of the impedance of said probe head based on the output from said oscillator means supplied to said probe head; and
   control means, responsive to the signals corresponding to the real and imaginary parts obtained from said detection means, for supplying, to said impedance adjusting element of said probe head, a control signal for adjusting the real and imaginary parts of the impedance of said probe head to coincide with a predetermined impedance,
   said detection means comprising a series circuit of first to fourth $\lambda/8$ cables connected between said oscillator means and said probe head, a first variable resistor connected to two ends of a series circuit of said first and second $\lambda/8$ cables each through diodes of predetermined polarities, and a second variable resistor connected to two ends of a series circuit of said second and third $\lambda/8$ cables each through diodes of predetermined polarities, and outputs voltages corresponding to the real and imaginary parts of the impedance from slider terminals of said first and second variable resistors, respectively.

2. An adjuster according to claim 1, wherein said impedance adjusting element comprises variable capacitor means.

3. An adjuster according to claim 1, wherein said impedance adjusting element comprises first variable capacitor means arranged substantially in parallel with an inductance of a coil of said probe head, and a pair of second variable capacitor means arranged substantially in series with two ends of said inductance.

4. An adjuster according to claim 3, wherein said first and second variable capacitor means comprise variable capacitance diodes.

5. An adjuster according to claim 3, wherein said first and second variable capacitor means comprise mechanical variable capacitor means.

6. An adjuster according to claim 3, wherein said control means includes means for negatively feeding back a control signal according to the signal corresponding to the real part to said second variable capacitor means, and negatively feeding back a control signal according to the signal corresponding to the imaginary part to said first variable capacitor means.

7. An automatic impedance adjuster for adjusting an impedance of a probe head in a MRI (magnetic resonance imaging) system to be equal to characteristic impedance, comprising:
   an impedance adjusting element, provided to said probe head, for allowing variable adjustment of real and imaginary parts of an impedance of said probe head;
   oscillator means, having a predetermined output impedance, for supplying a signal to said probe head;
   detection means, connected between said probe head and said oscillator means, for outputting detection signals respectively corresponding to the real and imaginary parts of the impedance of said probe head based on the output from said oscillator means supplied to said probe head; and
   control means, responsive to the signals corresponding to the real and imaginary parts obtained from said detection means, for supplying, to said impedance adjusting element of said probe head, a control signal for adjusting the real and imaginary parts of the impedance of said probe head to coincide with a predetermined impedance,
   said impedance adjusting element comprises first variable capacitor means arranged substantially in parallel with an inductance of a coil of said probe head, and a pair of second variable capacitor means arranged substantially in series with two ends of said inductance, and said control means includes means for negatively feeding back a control signal according to the signal corresponding to the real part to said second variable capacitor means, and negatively feeding back a control signal according to the signal corresponding to the imaginary part to said first variable capacitor means.

* * * * *